United States Patent [19]

Ovren

[11] Patent Number: 4,607,158

[45] Date of Patent: Aug. 19, 1986

[54] TEMPERATURE COMPENSATED LIGHT-GENERATING DEVICE

[75] Inventor: Christer Ovren, Västerås, Sweden

[73] Assignee: ASEA Aktiebolag, Västerås, Sweden

[21] Appl. No.: 565,339

[22] Filed: Dec. 27, 1983

[30] Foreign Application Priority Data

Dec. 30, 1982 [SE] Sweden .................................. 8207510

[51] Int. Cl.[4] .......................... G01D 5/26; G02B 5/20; H01J 3/00
[52] U.S. Cl. ..................................... 250/216; 250/227; 250/231 R; 313/499
[58] Field of Search .................... 250/216, 227, 231 R, 250/231 P, 552; 350/354, 588; 374/161, 162; 362/293, 800; 313/499

[56] References Cited

U.S. PATENT DOCUMENTS

| 4,408,123 | 10/1983 | Sichling et al. ................. 250/231 R |
| 4,409,476 | 10/1983 | Lofgren et al. ..................... 250/227 |
| 4,529,875 | 7/1985 | Brogardh et al. .............. 250/231 R |

FOREIGN PATENT DOCUMENTS 53-144601 12/1978 Japan .

Primary Examiner—Edward P. Westin
Attorney, Agent, or Firm—Watson Cole Grindle & Watson

[57] ABSTRACT

A light-generating element, for example an LED, a semiconductor laser or a body of photoluminescent material is arranged to have a temperature-independent output power characteristic by providing it with an optical filter having such a frequency-dependent transmission curve that the amplitude of the signal, emitted by the element, is, after passage through the filter, substantially independent of the temperature of the element.

9 Claims, 2 Drawing Figures

TEMPERATURE COMPENSATED LIGHT-GENERATING DEVICE

BACKGROUND OF THE INVENTION

1. Field of the Invention

The present invention relates to a light-generating device which comprises a light-generating element, for example a light-emitting diode (LED), a semiconductor laser, or a body of photoluminescent material.

It should be understood that the references to "light" in this specification mean electromagnetic radiation in and around the visible spectrum and thus include infra red and ultra violet radiation.

2. Description of the Prior Art

Light-generating elements, such as LEDs, lasers, or bodies of photo- or electro-luminescent material have many fields of application. A common property for such elements is that the emitted light intensity at a particular wavelength and for a given excitation level is most often temperature-dependent, i.e. the quantum efficiency of the element is temperature-dependent. For many applications, this temperature-dependence gives rise to considerable disadvantages and makes it necessary either to maintain the temperature of the element constant, or to measure the temperature of the element and make allowances for changes in the temperature of the element.

Examples of applications in which a temperature-independent quantum efficiency of a light-generating element is desirable are certain types of fiber-optic measuring devices such as those disclosed in U.S. Pat. No. 4,378,496 (granted Mar. 29, 1983 to Messrs. Brogårdh, Engström, Ovrén and Sander) which relates to fiber-optic current measurement in a diode, or in Swedish Pat. No. 428,056 which relates to a fiber-optic position transducer.

OBJECTS OF THE INVENTION

One object of the invention is to develop an improved light-generating device which does not require a thermostatically controlled enclosure. A further object is to provide a combination of a light-generating element and an optical filter, the transmission properties of the filter being matched to the temperature-dependent performance of the element so that the light output from the combination is sensibly temperature independent.

A still further object of the invention is to provide a method of making the spectral response of a light-generating element sensibly independent of temperature by combining it with a filter of a tailored spectral transmission characteristic.

SUMMARY OF THE INVENTION

These and other objects are achieved according to the invention by matching the wavelength/temperature properties of a light-generating element to an optical filter having such a transmission curve, as a function of wavelength, that a substantially temperature-independent output power is obtained for the emitted signal from the light-generating element after its passage through the filter. Thus, a device according to the invention is based on the fact that although a change in the wavelength distribution of the emitted signal from the element arises when the temperature of the element changes, the change in signal emitted is compensated for by the characteristics of the filter.

The transmission curve for the optical filter of a device according to the invention is adapted, on the one hand, to changes in the wavelength distribution of the emitted signal and, on the other hand, to the temperature-dependent quantum efficiency of the light-generating element.

BRIEF DESCRIPTION OF DRAWINGS

The invention will be further described in greater detail, by way of example, with reference to the accompanying drawing, wherein.

DESCRIPTION OF PREFERRED EMBODIMENT

Figure 1:
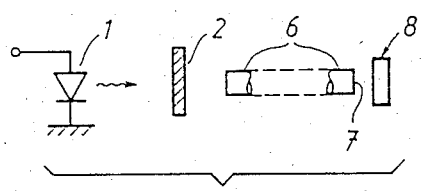
FIG. 1 shows a light-generating device according to the invention.

FIG. 1 shows a light-generating element 1, for example an LED, a semiconductor laser, or a body of photoluminescent material, in combination with an optical filter 2, which has such a transmission curve, as a function of wavelength, that a substantially temperature-independent output power is obtained from the device 1, 2 for the emitted signal after passage through the filter.

Figure 2:
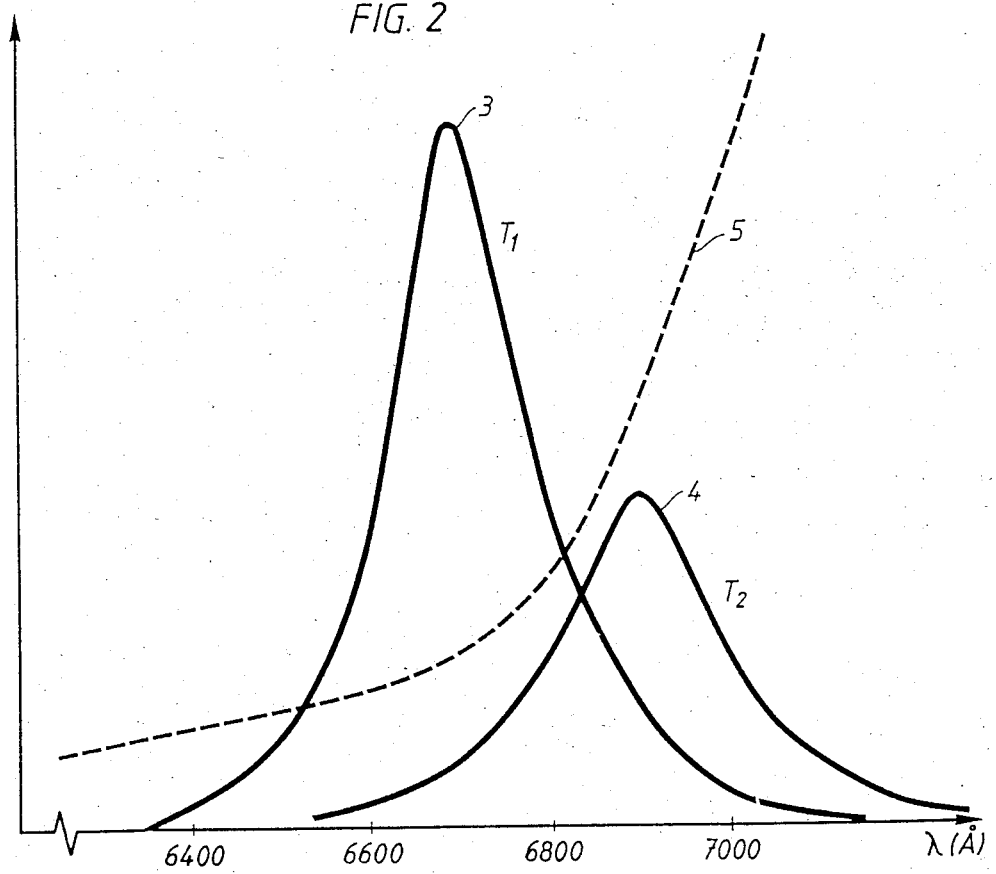
FIG. 2 shows the emission spectrum of an LED forming one part of the device of FIG. 1 at different temperatures and the transmission characteristics of the optical filter forming the other part of the device of FIG. 1.

FIG. 2 shows at 3 the emission spectrum of an LED at a temperature of $T_1$ and at 4 the emission spectrum at a temperature $T_2$. In addition, it also shows at 5 the transmission curve $S(\lambda)$ for the optical filter 2 which would be required to give the light-generating device 1, 2 of FIG. 1 a sensibly temperature independent output.

The transmission function $S(\lambda)$ which will give the filter 2 the required curve shape (5) is calculated as follows:

The emission spectrum L' for the LED can be expressed as $$L'(\lambda, T, I) = f(I) \times \eta(T) \times L_T(\lambda)$$

where $\lambda$ is the wavelength of the light, I is the electrical current flowing through the LED and T is the temperature of the LED. $L_T(\lambda)$ is assumed to be standardized, i.e.

$$\int_{-\infty}^{\infty} L_T(\lambda) d\lambda = 1$$

for all values of T.

It can be assumed that the required transmission function $S(\lambda)$ for the filter 2 will be given by $$S(\lambda) = \sum_{i=0}^{\infty} a_i \cdot \lambda^i$$

where $a_i$ are the constants in the series development of $S(\lambda)$.

The transmitted signal $\psi$ becomes as follows $$\psi = \int_{-\infty}^{\infty} S(\lambda) \times L'(\lambda, T, I) d\lambda =$$

-continued $$\int_{-\infty}^{\infty} f(I) \times \eta(T) \times L_T(\lambda) \times \sum_{i=0}^{\infty} a_i \lambda^i \cdot d\lambda$$

The condition for the signal, $\psi$, to be independent of T can be expressed as follows $$a_0 \int_{-\infty}^{\infty} L_T(\lambda)d\lambda + a_1 \int_{-\infty}^{\infty} \lambda L_T(\lambda)d\lambda +$$

$$a_2 \int_{-\infty}^{\infty} \lambda^2 \times L_T(\lambda)d\lambda + \ldots = \frac{CONST}{\eta(T)}$$

i.e. from spectra at different temperature values, $a_i$ can be calculated using multilateral regression analysis. The method can be illustrated by considering the following special cases:

$$L_T(\lambda) = L_0 \delta(\lambda - \lambda_0(T))$$

$$\psi = f(I) \times \eta(T) \times \int_{-\infty}^{\infty} L_0 \delta(\lambda - \lambda_0(T)) \times S(\lambda) \times d\lambda =$$

$$f(I) \times \eta(T) \times L_o \times S(\lambda_0)$$

If it is assumed that $\eta(T) = F - G \times T$ and $\lambda_0(T) = -D + E \times T$ (which are reasonable approximations for, for example, an LED at a temperature close to room temperature) then the fact that $\psi$ is independent of T implies that $$(F - G \times T) \times S(\lambda_O) = CONSTANT = C$$

Inserting $$S(\lambda) = \frac{C}{k_1 - k_2 \times \lambda}$$

Inserting this gives $$\begin{cases} k_1 = F + G \times D/E \\ k_2 = G/E \end{cases}$$

where $k_1$, $k_2$, F, G, D and E are constants.
The transmission curve 5 of the filter 2 becomes $$S(\lambda) = \frac{C}{F + \frac{GD}{E} - \frac{G}{E} \times \lambda}$$

The formula applies approximately also to spectra having larger half-widths.

An optical filter having a transmission curve which matches the above-noted expression may be manufactured using multi-layer techniques (interference filters).

A light-generating device 1, 2 developed as described above may, for example, be used in a measuring device according to the above-mentioned U.S. Pat. No. 4,378,496, to provide a device for measuring the electrical current which passes through one or more structures, as, for example, diodes. The passage of current thereby causes emission of light (electroluminescence). The luminescent structure(s) is/are arranged to emit light within at least two non-identical optical path intervals, and the said structure(s) is/are arranged with such a material composition and geometrical design that electroluminescence within said wavelength interval will have different, non-uniform current dependencies. The electroluminescence within said at least two wavelength intervals is arranged to be supplied to at least two photodetectors via at least one optical fiber, the photodetectors being formed with different sensitivity spectra and/or provided with optical fibers having different transmission and/or reflection spectra, whereby the sensitivity spectra and/or transmission and/or reflection spectra are adapted to the said wavelength intervals in such a way that at least one photodetector is arranged to selectively sense the electroluminescence in the whole of or in part of said wavelength interval. At least one further photodetector is arranged to selectively sense the electroluminescence in the whole of or part of said wavelength interval. At least one other photodetector is arranged to sense the electroluminescence in the whole of or part of at least a number of said wavelength intervals.

A light-generating device according to the invention and created as described above can also be applied to a device of the kind disclosed in the afore-mentioned Swedish Pat. No. 428,056, in which a fiber-optic measuring means is provided for measuring position, force, acceleration, pressure, flow or the like. The measuring means includes at least one optical fiber 6 (see FIG. 1), adjacent to one end surface 7 of which there is a sensor 8 having at least one body which is at least partially movable relative to the fiber end surface 7. This relative movement is a measure of the quantity to be measured, and the body has reflecting and/or photoluminescent properties. The illumination pattern generated upon illumination via the optical fiber on the movable body is given a shape which is essentially congruent with the reflecting and/or photoluminescent pattern present on the surface of the movable body.

Thus, a light-generating device according to the present invention can be applied to the previously described devices for the purpose of obtaining a temperature-independent output power and thus an improved performance.

The device described above can be varied in many ways within the spirit and scope of the invention as described in the following claims.

What is claimed is:

1. A light-generating device comprising a temperature-dependent light emitting element in combination with an optical filter, wherein
    the optical filter has such a transmission curve, as a function of wavelength, that a substantially temperature-independent output signal is obtained for the emitted signal from the device after light from the element has passed through the filter.

2. A light-generating device according to claim 1, in which the filter is a multi-layered structure.

3. A light-generating device according to claim 2, in which the filter is an interference filter.

4. A light-generating device according to claim 1, in which the filter is arranged between the element and a fiber-optic transmission line leading to a sensor.

5. A light-generating device according to claim 4, in which the sensor is a device for measuring current, traversing said light emitting element, whereby the passage of said current causes emission of light from said light emitting element.

6. A light-generating device according to claim 1, in which the light-emitting element is a light emitting diode (LED).

7. A light-generating device according to claim 1, in which the device is included in a fiber-optic measuring means having a sensor for measuring one of the quantities position, force, acceleration, pressure and flow, which device is adjacent to one end of an optical fiber means, the sensor being adjacent to the other end of said optical fiber means, at least one body being arranged adjacent to an end surface of said optical fiber means at said other end, which body is movable relative to the fiber end surface, whereby this relative movement is a measure of the quantity to be measured, said one body having at least one of a reflecting and a photoluminescent property.

8. A light-generating device according to claim 1, in which the light-emitting element is a semiconductor laser.

9. A light-generating device according to claim 1, in which the light-emitting element is a body of photoluminescent material.

* * * * *